(12) United States Patent
Salzmann et al.

(10) Patent No.: US 8,992,269 B2
(45) Date of Patent: Mar. 31, 2015

(54) CONNECTING DEVICE FOR A SOLAR MODULE

(71) Applicant: Tyco Electronics AMP GmbH, Bensheim (DE)

(72) Inventors: Kristopher Salzmann, Rossdorf (DE); Norbert Geister, Insheim (DE); Andreas Woeber, Hirschberg (DE)

(73) Assignee: Tyco Electronics AMP GmbH, Bensheim (DE)

( * ) Notice: Subject to any disclaimer, the term of this patent is extended or adjusted under 35 U.S.C. 154(b) by 2 days.

(21) Appl. No.: 13/868,974

(22) Filed: Apr. 23, 2013

(65) Prior Publication Data
US 2013/0280946 A1    Oct. 24, 2013

(30) Foreign Application Priority Data
Apr. 24, 2012    (DE) .................... 10 2012 206 731

(51) Int. Cl.
*H01R 4/48*    (2006.01)
*H01R 24/62*    (2011.01)
*H01L 31/00*    (2006.01)

(52) U.S. Cl.
CPC ................ *H01R 4/48* (2013.01); *H01R 24/62* (2013.01); *H01L 31/00* (2013.01)
USPC ............................................. 439/828

(58) Field of Classification Search
USPC .................... 439/816, 828, 834, 835
See application file for complete search history.

(56) References Cited

U.S. PATENT DOCUMENTS

| | | | | |
|---|---|---|---|---|
| 1,005,323 A | * | 10/1911 | Schade, Jr. .................... | 439/828 |
| 1,005,786 A | * | 10/1911 | Schade, Jr. .................... | 439/828 |
| 5,816,867 A | * | 10/1998 | Davidsz et al. ............... | 439/828 |
| 7,344,422 B2 | * | 3/2008 | Helmreich .................... | 439/835 |
| 8,075,326 B2 | * | 12/2011 | Quiter et al. .................. | 439/224 |
| 8,152,536 B2 | * | 4/2012 | Scherer et al. ............... | 439/76.1 |

* cited by examiner

*Primary Examiner* — Tho D Ta
(74) *Attorney, Agent, or Firm* — Faegre Baker Daniels LLP (57) ABSTRACT

The invention relates to a connection device for a solar module, comprising a housing, at least one contact rail which is arranged in the housing, and at least one contacting device for contacting an electrical conductor, the contacting device being able to be fitted to the contact rail and being able to be moved at least between an initial position (AS) and an end position (ES).

13 Claims, 7 Drawing Sheets

CONNECTING DEVICE FOR A SOLAR MODULE

BACKGROUND OF THE DISCLOSURE

The invention relates to a connection device for a solar module, having a housing, a contact rail which is arranged in the housing, and an electrical contacting device for contacting an electrical conductor.

SUMMARY OF THE DISCLOSURE

A photovoltaic solar module or solar panel typically comprises a plurality of solar cells, which convert radiation energy directly into electrical energy. At a rear side of the solar module, there is generally provided an electrical connection device which is used to electrically connect an electrical conductor of the solar module, for example, foil or flat conductors or strips which extend out therefrom, to connection cables. Via the connection cables, a plurality of connection devices and consequently solar modules can be electrically connected to each other. For example, a serial connection of solar modules is conventional in order to achieve production of higher electrical voltages. Furthermore, the solar modules can be connected to other devices, such as, for example, inverters, via the connection cables.

In a conventional construction, an electrical connection device, which is often also referred to as a solar box, comprises a housing having through-recesses for introducing electrical contact regions of the foil or flat conductors of the relevant solar module, and a contacting device which is arranged inside the housing for electrically contacting the foil conductors. The contacting device comprises, for example, conductor rails which are soldered to clamps and to which the foil conductors of the solar module can be electrically connected and to which the connection cables mentioned above are also electrically connected. It is known, for example, from DE 10 2005 025 632 A1 to carry out electrical contacting by means of so-called omega springs or omega clamps.

This involves the problem that this electrical contacting is intended to be configured by means of a comparatively lengthy method, and the quality of the contacting can be verified afterwards only with difficulty.

Furthermore, the specific construction and/or assembly of the omega clamp involve(s) specific disadvantages per se. For example, a further reduction of the solar box dimension using such a clamp can be carried out only with difficulty. Furthermore, the production of such a clamp is complex.

An object of the invention is to provide a connection device for a solar module, which has a compact contacting device which is simple to produce and which nonetheless enables reliable contacting of a foil conductor.

The object of the invention is achieved with a connection device for a solar module according to claim 1. Advantageous developments, additional features and/or advantages of the invention will be appreciated from the dependent claims and the following description.

The connection device according to the invention comprises a housing, at least one contact rail which is arranged in the housing and at least one contacting device for contacting an electrical conductor, the contacting device being able to be fitted to the contact rail and being able to be moved at least between an initial position and an end position.

The contact rail acts inter alia as a conductor rail and, when contacting a foil conductor, transfers the electric current in known manner for this type of connection devices. The contact rail comprises, for example, at least one diode retention member, as is conventional for such devices. The connection device may be constructed, depending on requirements, with one or more contact rails, individual conductor rails being able to be electrically connected to each other by means of diodes. The contact rail is, for example, a conductor rail which is constructed as a punched grid. For example, the contact rail extends between an insertion opening for introducing a foil conductor into the connection device and a cable connection region of a connection cable.

For example, the initial position may be the position in which the contacting device which is mounted on the contact rail does not contact the electrical conductor so that, only in the end position, contacting between the contacting device and conductor is carried out.

The end position is, for example, the position in which the electrical conductor is clamped by means of at least the contacting device. In such a preferred embodiment, the end position can accordingly also be described as a clamping position.

Preferably, the contacting device which is mounted on the contact rail applies, both in the initial position and in the end position, a clamping action against the contact rail, but produces the contacting with the conductor only in the end position. This contributes to a compact structural form since the contact rail is used in an optimum manner and not only takes on the function of the current transmission, but is also used for clamping or contacting the foil conductor.

The contacting device is preferably a separate component, that is to say, a component which is separate from the contact rail. This enables simple and cost-effective production of the contacting device and also the contact rail.

In one embodiment of the connection device, the contacting device is constructed in such a manner that a contacting space is formed between an inner peripheral face of the contacting device and the contact rail. This affords the advantage of a compact construction of the contacting device. The structural height of the contacting device can thereby be reduced since the contacting space is partially formed by the contact rail. Furthermore, this affords the advantage that the contact rail itself can be kept compact.

According to another preferred embodiment, the contacting device comprises an upper wall, the inner side of which is opposite a surface of the contact rail. Accordingly, connection devices with particularly compact structural forms are possible since the contacting device does not have to be constructed behind the contact rail when viewed in the longitudinal direction of the contact rail. That is to say, the contacting device and the contact rail according to this embodiment do not have to be arranged one behind the other, that is to say, in series. This enables a particularly compact construction of the contacting device and consequently optimal use of the inner space of the connection device.

According to a preferred embodiment, the upper wall comprises a tool through-opening. This enables efficient use of the space and contributes to a compact structural form of the contacting device.

According to another preferred embodiment, a clamping means protrudes from the upper wall into the contacting space. The clamping means is, for example, a resilient arm, which resiliently abuts the contact rail in the initial position and consequently applies a clamping action together with the contact rail. In the end position, the resilient arm is also in abutment against the contact rail, the foil conductor being clamped between a contacting portion of the resilient arm or clamping means and the contact rail in the end position. Consequently, the contact rail is used in an optimum manner, whereby the structural form of the contacting device is reduced.

At least a portion of the clamping means may, if desired, extend outside the contacting space, at least the contacting portion of the clamping means, that is to say, the portion which directly contacts the conductor, preferably being located in the contacting space. The resilient arm is, for example, constructed as a lamellar spring, a bow spring or the like.

According to a preferred embodiment, the clamping means further has a tool engagement portion.

According to a particularly preferred embodiment, the clamping means abuts the contact rail in the initial position. Accordingly, reliable contacting is ensured since the initial position of the clamping means makes provision for it to abut the contact rail. Consequently, no complex verification or checking is required to ensure that the clamping means is located in the clamping position.

In another embodiment of the invention, the contacting device of the connection device comprises at least one side wall which has a positioning device which extends in the longitudinal direction of the contacting device. The positioning device may, for example, be constructed in the form of a recess in the side wall so that this recess receives a longitudinal side of the contact rail. It is thereby possible to achieve reliable assembly of the contacting device on the contact rail. For example, two opposing side walls of the contacting device have such a positioning device. After assembly of the contacting device, the contact rail accordingly forms a type of floor in the contacting space, the side walls of the contacting device forming the side walls and the upper wall of the contacting device opposite the contact rail forming the cover of the contacting space.

The maximum spacing between the side walls of the contacting device is preferably selected in such a manner that it corresponds approximately to the width of the contact rail. In the embodiment with recesses as a positioning device, for example, the maximum spacing is the spacing measured from the bottom of the recess of one side wall to the bottom of the recess of the other side wall. Accordingly, the contacting device can be reliably fixed to the contact rail.

Furthermore, a side wall of the contacting device may have at least one engaging device instead of or in addition to the positioning device. One advantage of the engaging device is the particularly reliable retention of the contacting device with respect to the contact rail because the engaging device or the engaging devices act(s) counter to a force of a tool which engages in the clamping means in order to lift it. The engaging device may protrude, for example, from the side wall and comprises, for example, a plurality of projections which are distributed in such a manner that they—after the assembly of the contacting device—abut both the upper side and the lower side of the contact rail. Specific adaptation of the contact rail is not necessary so that a cost-effective and reliable fixing of the contacting device can be achieved.

According to another preferred embodiment, the contacting device may be constructed integrally, in particular formed in one piece from a sheet metal material. This allows cost-effective and simple production of the contacting device. The contacting device is a separate component from the contact rail and can consequently be produced in a cost-effective manner.

The above mentioned and other features of the invention, and the manner of attaining them, will become more apparent and the invention itself will be better understood by reference to the following description of embodiments of the invention taken in conjunction with the accompanying drawings.

DETAILED DESCRIPTION OF THE DRAWINGS

Corresponding reference characters indicate corresponding parts throughout the several views. Unless stated otherwise the drawings are proportional. The embodiments disclosed below are not intended to be exhaustive or to limit the invention to the precise forms disclosed in the following detailed description. Rather, the embodiments are chosen and described so that others skilled in the art may utilize their teachings. While the present disclosure is primarily directed to a solar module, it should be understood that the features disclosed herein may have application to other connection devices.

Figure 1:
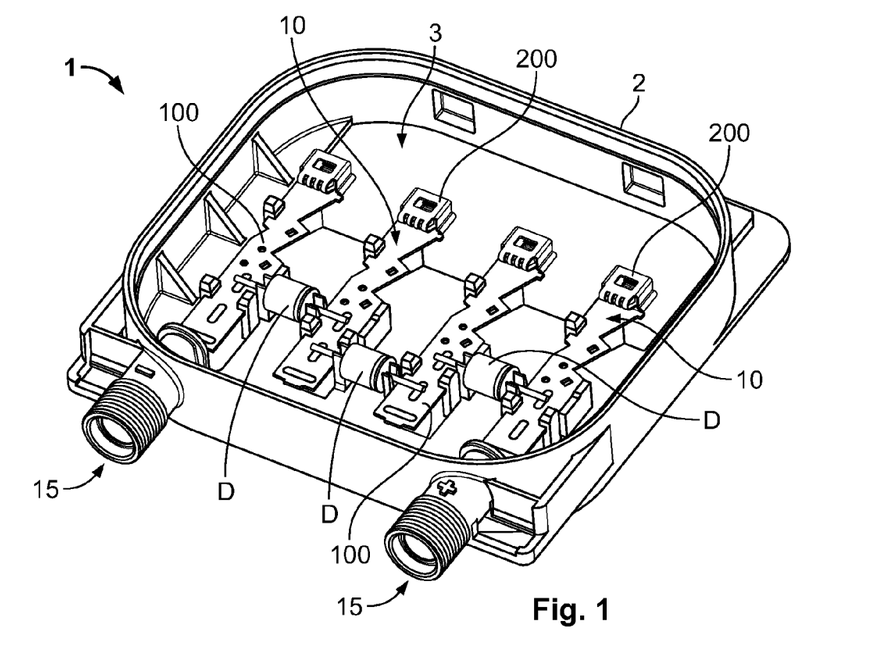
FIG. 1 is a perspective view of a connection device according to a first embodiment.
Figure 2:
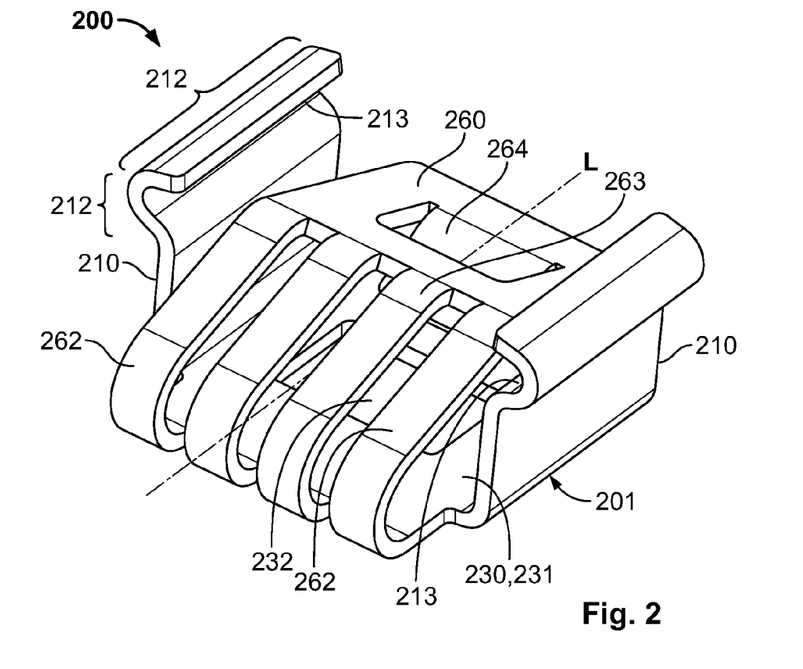
FIG. 2 is a perspective bottom view of a first embodiment of a contacting device.
Figure 11:
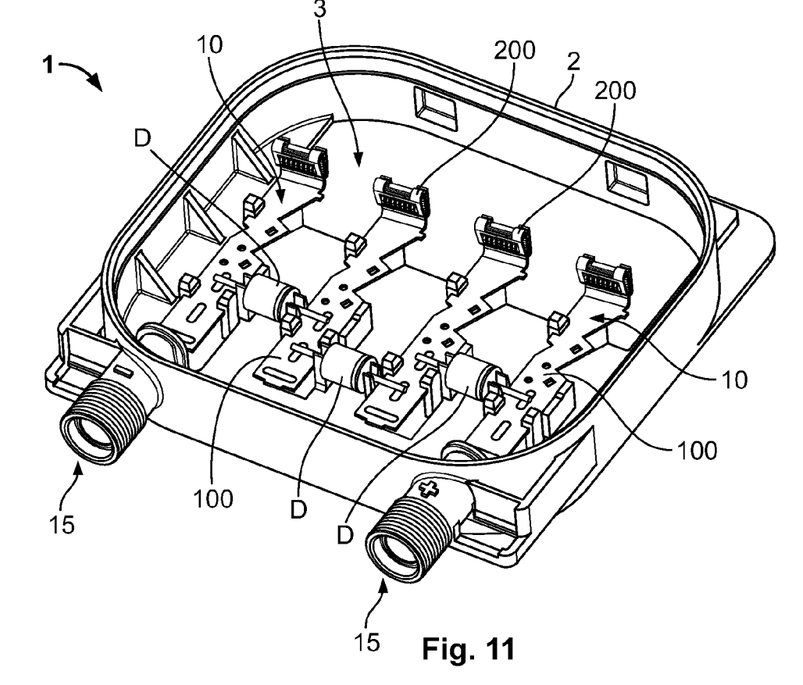
FIG. 11 is a perspective view of a connection device for a solar module having a contacting device according to a third embodiment.
Figure 12:
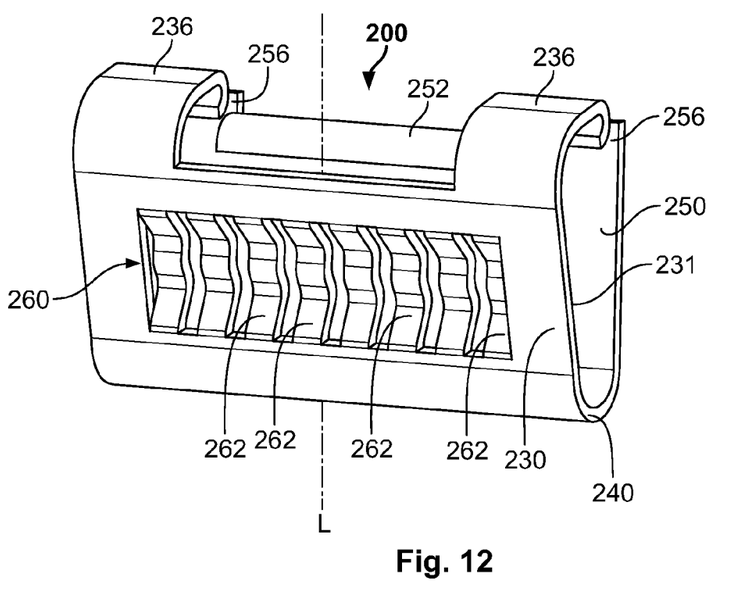
FIG. 12 is a perspective view of the third embodiment of the contacting device.
Figure 13:
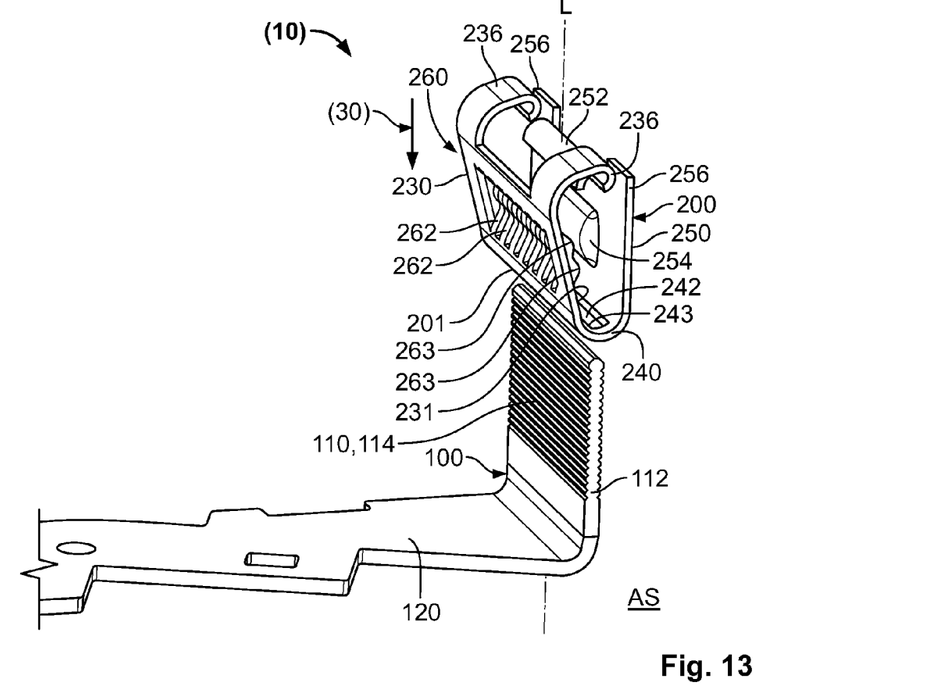
FIG. 13 is a perspective view, broken away in a rear portion, of an assembly of the contacting device from FIG. 12.

The invention is explained in greater detail below with reference to embodiments and the appended drawings. In the detailed Figures of the drawings:

FIG. 1 (and also FIG. 11) shows an electrical connection device 1 or solar box 1 for a solar module, having four electrical contacting arrangements or devices 10 for the electrical contacting of electrical conductors 20, in particular foil conductors 20 (see FIGS. 6-8 and 15-17) of the solar module.

The contacting device 200 is constructed in such a manner that it can produce an electrical clamping connection for the electrical conductor 20 together with the contact rail 100 belonging thereto.

The contact rail 100 is constructed as a conductor rail 100, in particular a Z conductor rail 100 having diode retention members, three diodes D being illustrated in the embodiment according to FIG. 1. The function of the diodes D is generally known to the person skilled in the art and is not explained in greater detail here. In the embodiment shown according to FIG. 1, four contact rails 100 can be seen, with the two outer rails each also having a cable connection region for a connection cable.

The contact rail 100 (see in particular FIGS. 1, 3, 9, 11 & 13) has an electrical contact portion 110 for contacting the conductor 20 or an assembly portion 110 for the contacting device 200 for clamping the conductor 20, and a more extensive portion 120. The more extensive portion 120 acts, in the case of the external contact rails, as a contact region for the connection cables which are introduced into the inner space of the connection device through connection cable introduction openings 15 provided in the housing 2.

The housing 2 has an introduction opening 3 for introducing the foil conductor 20 into the inner space of the housing 2, the end of the conductor rail 100 associated with that introduction opening 3 being arranged above that introduction opening 3 (FIG. 1).

The contact portion 110 of the conductor rail 100 is preferably constructed so as to be flat and in particular rectangular or square and has narrow longitudinal sides 112 and planar longitudinal sides 114. Furthermore, the more extensive portion 120 may have a collar 122 or a shoulder 122 for mounting the contacting device 200 on the conductor rail 100 directly beside the contact portion 110, preferably at the narrow longitudinal sides 112. The collar 122 has such dimensions that the contacting device 200 cannot be pushed further onto the conductor rail 100 or pressed thereon. The drawing further shows a longitudinal extent L or a longitudinal axis L of the contact portion 110 and optionally the contact rail 100 and a longitudinal direction L of the contacting device 200, respectively.

In the first two embodiments (see FIGS. 1-10), the contacting device 200 comprises a cage 201 having two side walls 210 and an upper wall 230 connecting them. The two side walls 210 are laterally configured in the cage 201, that is to say that they are fixed in an assembly end position of the contacting device 200 to the contact portion 110, in particular the narrow longitudinal sides 112 of the contact portion 110, the side walls 210 being arranged substantially parallel with the narrow longitudinal sides 112. The narrow longitudinal sides 112 and the side walls 210 are all preferably arranged substantially parallel with each other. Furthermore, the upper wall 230 is substantially parallel with the contact portion 110 or the surface 111 thereof after the contacting device 200 has been mounted on the conductor rail 100.

The cage 210 preferably encloses a parallelepipedal or cubic space or a contacting space KR at three sides. In particular, the inner peripheral face of the contacting device 200 or the cage 201 forms the contacting space KR together with the surface 111 of the contact portion 110 of the conductor rail 100. After the contacting device 200 is fixed to the contact portion 110 of the conductor rail 100, the contact portion 110 takes up the function of a bottom wall of the cage 201, which can best be seen in FIG. 4.

Figure 6:
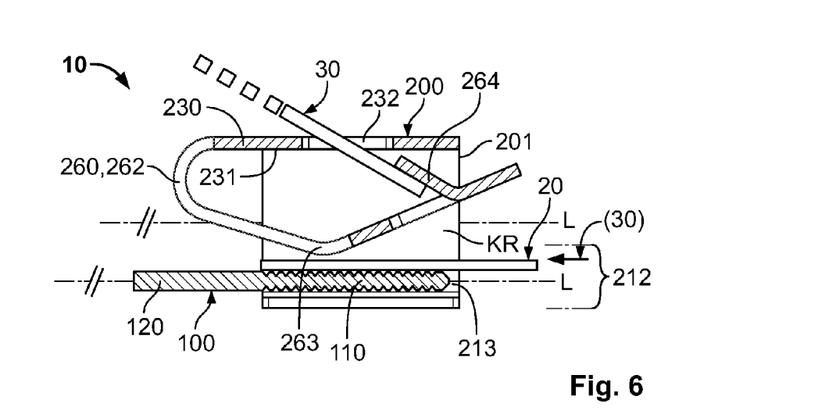
FIG. 6 is a view similar to FIG. 5 of a second assembly step during the provision of the flat conductor in the contacting device.
Figure 8:
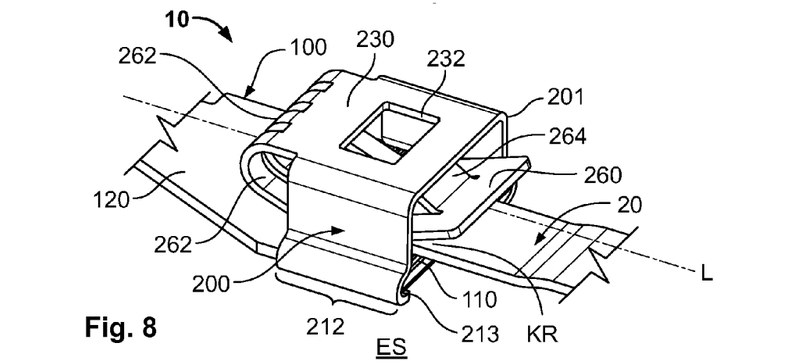
FIG. 8 is a perspective view of a configured electrical connection of a flat conductor with the first embodiment of the contacting device.
Figure 9:
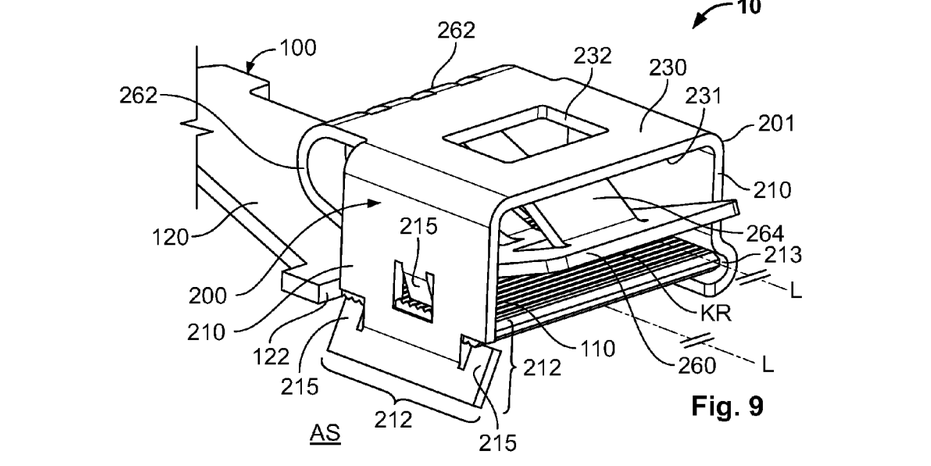
FIG. 9 is a perspective view, broken away in a rear portion, of a second embodiment of the contacting device.

From a rear edge of the upper wall 230, a contact spring 260 or a clamping means 260 projects into the contacting space KR so that the distal end of the clamping means 260 projects beyond a front edge of the upper wall 230 (see FIGS. 8 and 9). As can be seen in FIG. 6, the contact spring 260 extends from the rear edge of the upper wall 230 initially slightly further backwards (in the direction of the arrow 30 according to FIG. 6), then bends downwards in an arc which extends over, for example, between 110° and 160°, and extends at an angle in the direction of the lower delimitation of the cage 201. In a central region of the cage 201, the contact spring 260 again has an arc which extends over, for example, between 30° and 90°, and then extends linearly as far as a location beyond an outer delimitation of the cage 201 or the front edge of the upper wall 230.

The contact spring 260 has in a central portion a plurality of resilient plates 262 or ribs 262 which are cut or stamped out of it. That is to say, the resilient plates 262 are connected at both sides within the contact spring 260, at one side in the region of the rear edge of the cage 201 and, at the other side, to a free longitudinal end portion of the contact spring 260 which is preferably constructed so as to be closed in the transverse direction of the contact spring 260. At the free longitudinal end portion, the contact spring 260 has an actuation device 264 or a tool engagement portion 264 in order to actuate, in particular lift, the contact spring 260. The actuation device 264 is preferably in the form of a tab 264 which is cut or stamped from the contact spring 260 and which is bent out of a relevant plane of the contact spring 260. Instead of a tab 264, for example, a through-recess can also be used.

The contact spring 260 is preferably configured in such a manner that it adjoins the contact portion 110, which is grooved at least at one side, with mechanical pretensioning after the assembly of the contacting device 200. In this instance, the arc of the contact spring 260 forms a defined contacting region 263 for the conductor 20 in the central region of the cage 201. When the contact spring 260 is in a mechanically relieved position, as illustrated, for example, in FIG. 2, the contact spring 260 can be constructed in such a manner that it projects into an assembly region for the contact portion 110; during the assembly, the contact spring 260 then slides onto the contact portion 110 so that the contacting region 263 directly adjoins the contact portion 110 after assembly, that is to say, in the initial position AS.

Figure 3:
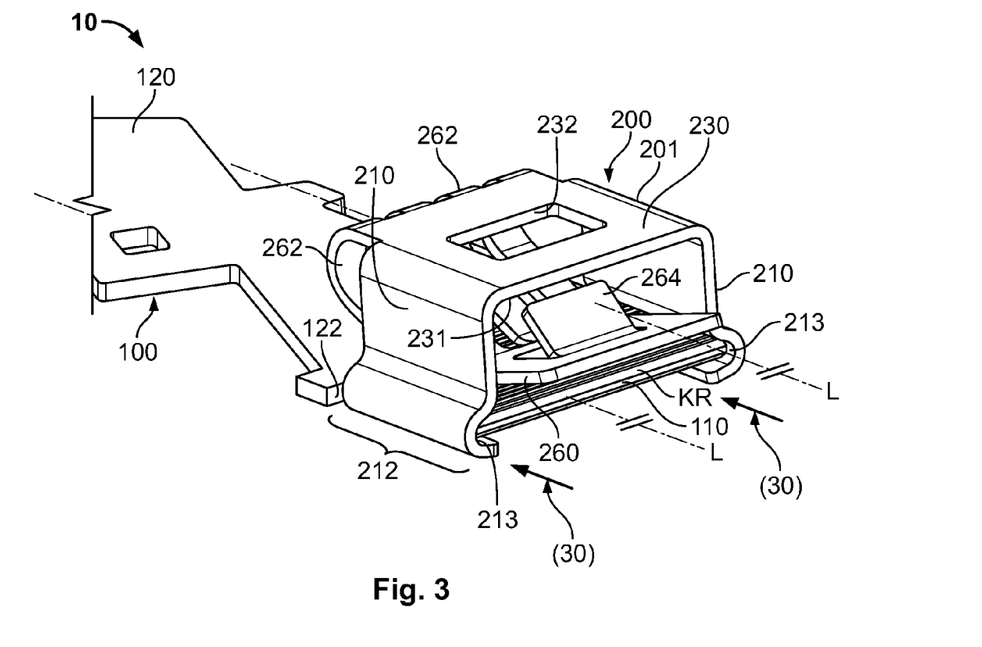
FIG. 3 is a perspective view, broken away in a rear portion, of the first embodiment of the contacting device ready for use.
Figure 4:
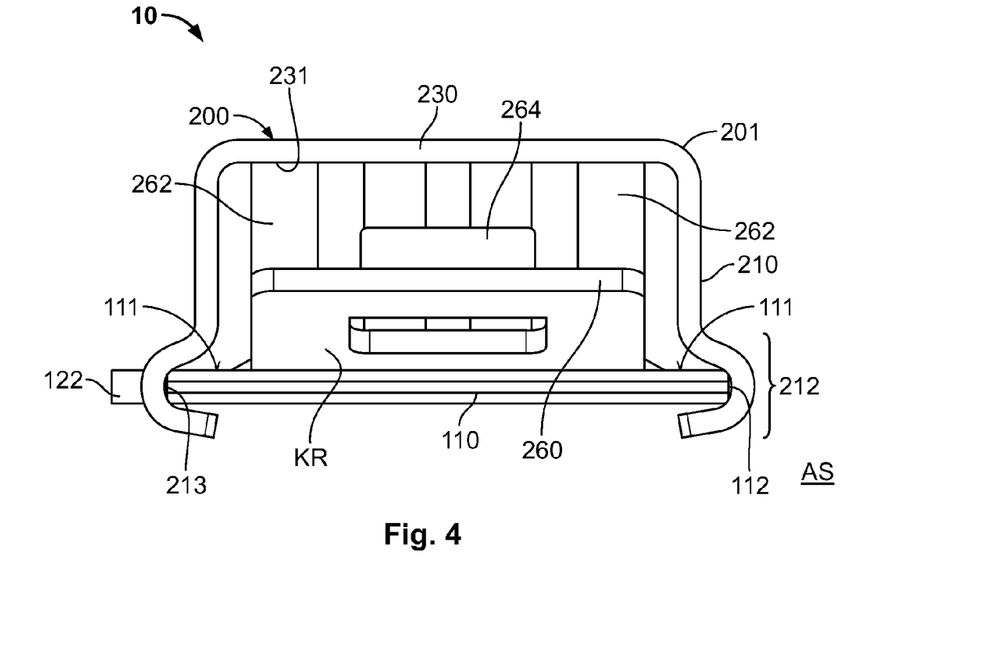
FIG. 4 is a front-end view of the contacting device according to FIG. 2.

In the first embodiment illustrated in FIGS. 1 to 8, the contacting device 200 is configured in such a manner that it is pushed onto the contact rail 100 in the longitudinal direction L (see FIG. 3). This may be carried out, for example, by means of a tool 30 or by hand. The contacting device 200 is pushed as far as the collar 122 so that correct assembly is ensured. After the assembly, the contact clamping device 200 is then in a state clamped to the contact portion 110 and takes up the initial position AS. For this purpose, the two side walls 210 preferably have substantially identical fixing portions 212 or regions 212. The side wall 210 or fixing portion 212 has, in a lower region which is directed towards a free end of the side wall 210, a positioning device 213 which extends mainly or substantially in a longitudinal direction L and which can be formed, for example, as a bead 213 or recess 213, respectively.

The positioning device 213 extends through the side wall 210, 210, preferably parallel with an edge of the cage 201 and/or preferably over an entire longitudinal extent L. The positioning device 213 is preferably formed in such a manner that a metal sheet of the contact clamping device 200 is bent in the manner of a half-pipe or in the manner of a channel at the free longitudinal end portion of the side walls 210, which can clearly be seen in FIGS. 2 to 4 and 10.

In this first embodiment, consequently, the clamping means or the resilient arm 260—in particular the contacting region 263 of the resilient arm 260—is pretensioned against the contact rail 110 both in the initial position AS and in the end position ES, with the foil conductor 20 being clamped in the end position ES. By a tool being engaged in the tool receiving member 260, the resilient arm 260 is moved out of its initial position AS so that the foil conductor 20 can be pushed into the contacting space KR. After the foil conductor 20 has been introduced, the resilient arm 260 is moved into the end position ES, in which the foil conductor is clamped between the resilient arm 260 and the contact rail 100.

Accordingly, the upper wall 230 is arranged opposite a surface of the conductor rail 100 so that the resilient arm 260 acts on the conductor rail. This contributes to a compact structural form because the conductor rail 100 is optimally used and not only fulfils the function of transmitting electrical current but also contributes to the clamping effect of the foil conductor.

Figure 10:
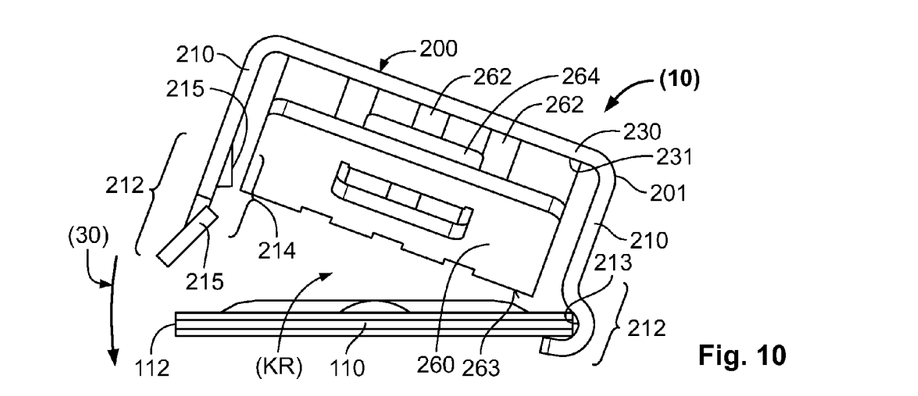
FIG. 10 is a front-side view of the second embodiment of the contacting device to be produced according to FIG. 9.

In the second embodiment illustrated in FIGS. 9 and 10, the contacting device 200 is configured in such a manner that it can be placed or clip-fitted on the contact portion 110 in a transverse direction, that is to say, in a state offset at a 90° angle relative to the longitudinal direction L (see FIG. 10), in order consequently to mount the contacting device 200 on the contact rail 100. To that end, a side wall 210 has a positioning device 213 similar to the first embodiment. During the assembly of the contacting device 200, the positioning device 213 functions in the manner of a hinge 213, which can best be seen in FIG. 10.

The other fixing portion 212 of the second side wall 210 has an engaging device 214 or clip-fit device 214. The engaging device 214 has three engaging members 215 which clamp the narrow longitudinal side 112 of the contact portion 110 between them after the contact clamping device 200 has been mounted on the conductor rail 100 (see FIG. 9). In this instance, at least two engaging members 215 of the engaging device 214 are opposite each other. A free longitudinal end portion of the second side wall 210 has two engaging members 215 which cooperate with an engaging member 215 cut out of the side wall 210 after the assembly of the contacting device 200. The cut-out engaging member 215 is arranged between the two engaging members 215 of the free longitudinal end portion but in a state vertically offset in relation thereto (see FIG. 9).

The second embodiment of the contacting device 200 is assembled as follows. Firstly, the contacting device 200 having the positioning device 213 of the first side wall 210 is placed obliquely against the first narrow longitudinal side 112 of the contact portion 110, which is illustrated in FIG. 10. Subsequently, the entire contacting device 200 is pivoted about the longitudinal axis L of the contact portion 110 towards that portion, the engaging device 214 of the second side wall 210 engaging or clip-fitting with the second narrow longitudinal side 112 of the contact portion 110, which is illustrated in FIG. 9.

After assembly, the contacting device 200 is then fixed to the contact portion 110 in a locked or clamped manner so that the contacting device 200 takes up its initial position AS.

As in the first embodiment, consequently, the clamping means or the resilient arm 260 is also pretensioned in this second embodiment both in the initial position AS and in the end position ES against the contact rail 100, the foil conductor 20 being clamped in the end position ES. By a tool being engaged in the tool receiving member 260, the resilient arm 260 is moved out of its initial position AS so that the foil conductor 20 can be pushed into the contacting space KR. After the foil conductor 20 has been introduced, the resilient arm 260 is moved into the end position ES, in which the foil conductor 20 is clamped between the resilient arm 260—in particular the contacting region 263 thereof—and the contact rail 100.

The upper wall 230 is accordingly arranged so as to be opposite a surface 111 of the contact rail or conductor rail 100 so that the resilient arm 260 acts on the conductor rail 100. This contributes to a compact structural form because the conductor rail 100 is optimally used and not only fulfils the function of transmitting electric current but also contributes to the clamping action of the foil conductor 20.

Figure 5:
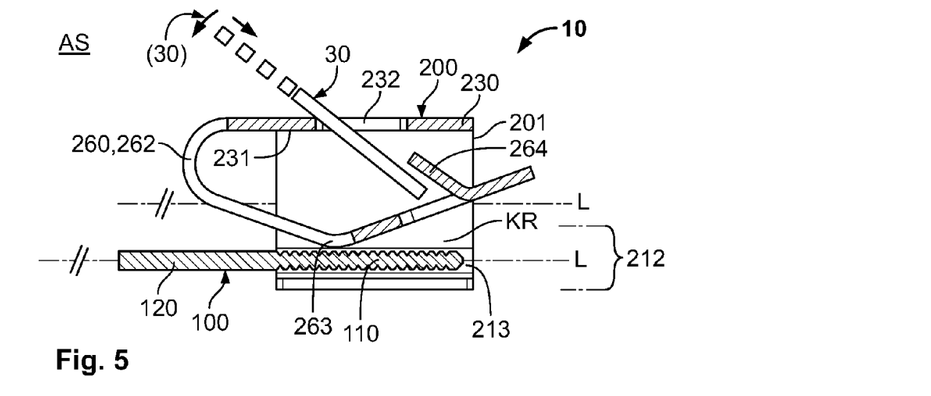
FIG. 5 is a sectioned side view of the contacting device according to FIG. 3 of a first assembly step for providing an electrical flat conductor in the contacting device.
Figure 7:
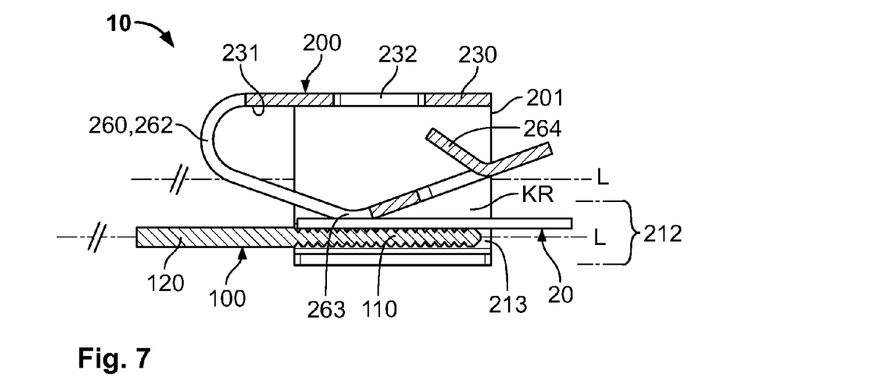
FIG. 7 is again a view similar to FIG. 5 of a third assembly step when the flat conductor is being fixed in the contacting device.

The contacting of the foil conductor 20 according to the first and second embodiments is explained in greater detail below with reference to FIGS. 5 to 7. FIG. 5 shows the contact spring 260 in the initial position AS, in which the contact spring 260 abuts the contact rail 100. First, the contacting region 263 of the contact spring 260 must be lifted so that the foil conductor 20 can be introduced into the contacting space KR of the contacting device 200. To that end, the contact spring 260 is lifted by means of the actuation device 264, which may be carried out manually, for example, by means of a screwdriver 30, or automatically. So that the corresponding tool can be moved towards the tool engagement portion 264 (FIG. 5), the upper wall 230 of the contacting device 200 has a through-recess 232 which is preferably constructed as a tool through-opening 232 and through which the tool 30 can be moved towards the tool engagement portion 264.

Subsequently (FIGS. 5=>6), the tool 30 is positioned at an edge of the through-recess 232 and pivoted downwards (see FIG. 5) so that the contacting region 263 rises. The conductor 20 can now be introduced into the contacting space KR formed by the contacting device 200 and the contact rail 100 (FIG. 6). If the conductor 20 is in the correct position, the tool 30 which lifts the contacting region 263 is removed so that the contacting region 263 of the contact spring 260 moves backwards and clamps the conductor 20 against the surface 111 of the contact portion 110, whereby the end position ES of the contacting device 200 is also reached.

Figure 14:
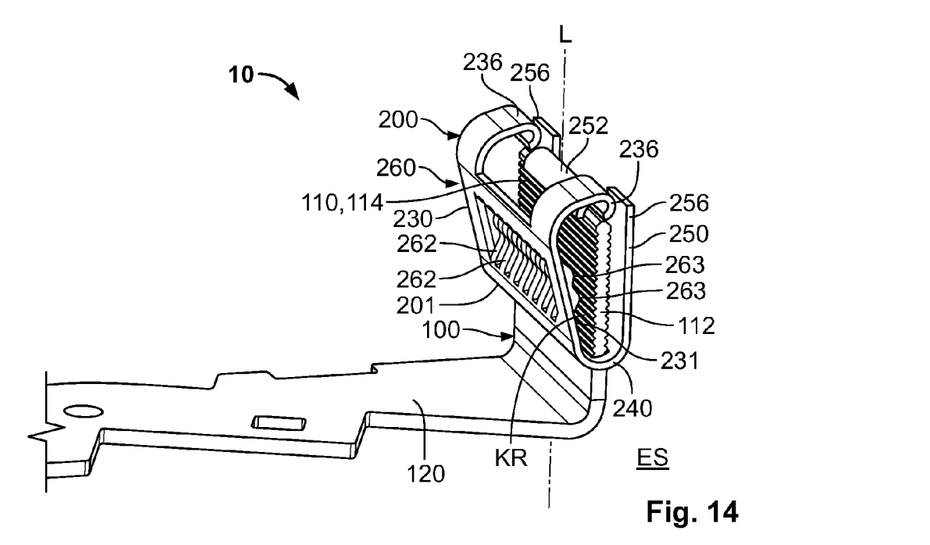
FIG. 14 is a perspective view, broken away in a rear portion, of the third embodiment of the contacting device ready for use.

In the third embodiment (see FIGS. 11-17), the cage 201 has, unlike the first two embodiments, a single side wall 240 which may also be referred to as a transition region 240 between a bottom wall 250 and the upper wall 230 or a contact spring 260 (see below) of the cage 201. The cage 201 or the contacting device 200 is constructed in such a manner that it can be pushed over the contact portion 110 of the contact rail 100, the contacting device 200 engaging in the end position with the contact portion 110. In this instance, the contacting device 200 is constructed in an abstracted state as a v-like bracket which can be fitted over the contact portion 110 and can be mounted thereon via a through-recess 242 in the side wall 240, that is to say, the back of the v-like bracket (see FIGS. 13 and 14).

Figure 15:
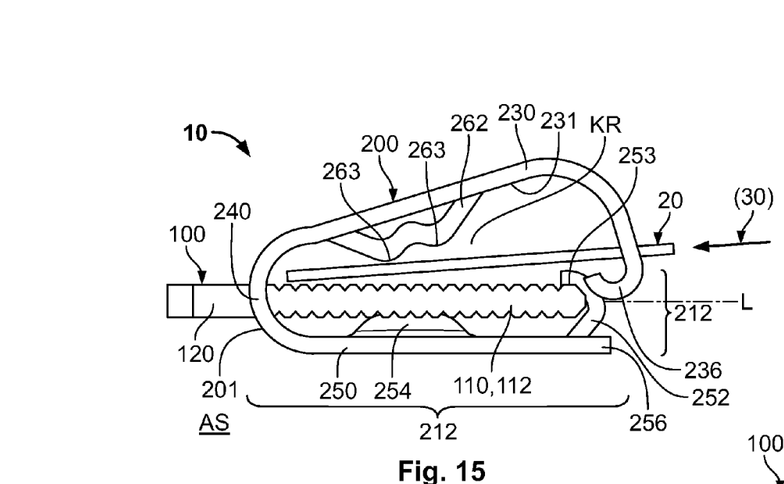
FIG. 15 is a side view of the contacting device from FIG. 14 showing a first assembly step during the provision of a flat conductor in the contacting device.
Figure 16:
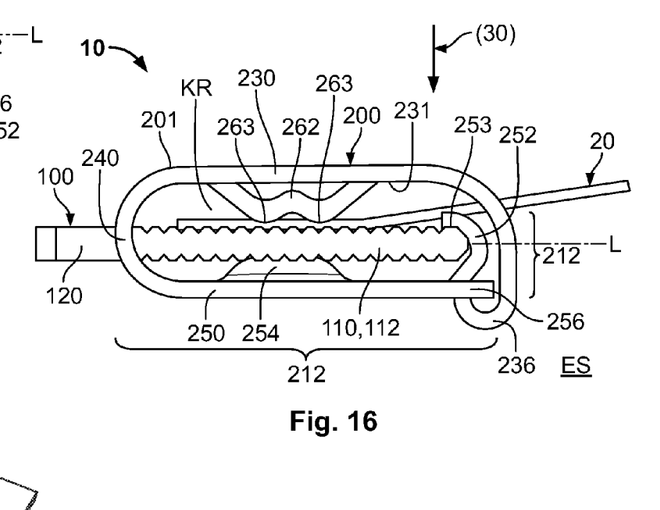
FIG. 16 is a view similar to FIG. 15 of a second assembly step during the fixing of the flat conductor in the contacting device.

After the contacting device 200 has been mounted on the contact portion 110, as shown in FIGS. 15 and 16, an upper edge 243 of the through-recess 242 and an inner edge 253 of a front engaging tab 252, which is preferably provided on the lower wall 250 or is cut or stamped out of the lower wall 250, co-operate, at one side of the contact portion 110, with the lower wall 250, preferably a projection 254 of the lower wall 250 projecting inwards into the cage 210, at the other side of the contact portion 110. That is to say, the contact portion 110 is clamped between the upper edge 243 of the through-recess 242, the inner edge 253 of the engaging tab 252 and the projection 254 of the lower wall 250, which can best be seen in FIGS. 15 and 16. In this instance, the projection 254 may be constructed, for example, as a bead 254.

The contact spring 260 is preferably also constructed as a lamellar spring 260 or a rib spring 260. In this instance, it is preferable for the contact spring 260 to be configured as a lamellar spring device 260 or rib spring device 260 in the upper wall 230. The contact spring 260 again has individual resilient plates 262 or ribs 262 which, in a central portion, have at least one contacting region 263 in the form of a projection. Two contacting regions 263 which are preferably configured in a double S-like manner in the resilient plate 262 are preferably used per resilient plate 262, respectively.

Depending on the viewpoint, the contact spring 260 is integrated in the upper wall 230 in this embodiment or the upper wall 230 itself is the contact spring 260. This is because the entire upper wall 230 is resiliently movable via the side wall 240 or the transition region 240 from the assembly of the contacting device 200 on the contact portion 110 (FIG. 15). At a free end, the upper wall 230 or the contact spring 260 preferably has laterally, that is to say, laterally at a transverse end, respectively, an engaging device 236 which is preferably constructed as a tab 236 which extends in the direction of the lower wall 250 and which is bent over at a free end preferably through at least approximately 90°, in particular through approximately 180°.

Figure 17:
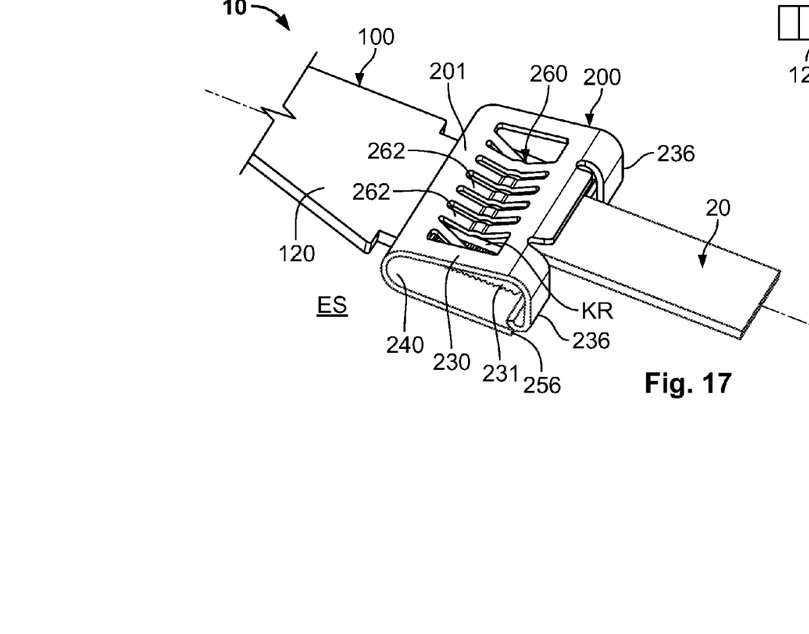
FIG. 17 is a perspective view of a configured electrical connection of the flat conductor with the third embodiment of the contacting device.

A free end of the upper wall 230 or the contact spring 260 is arranged between the tabs 236, a bent tab being able to be provided in this instance for the simplified introduction of the conductor 20 (only FIG. 17). The engaging devices 236 are configured in such a manner that they can engage behind or below the lower wall 250 in a clamping position or end position ES (see FIG. 16) of the contact clamping device 200. To that end, the lower wall 250 is drawn forwards to a corresponding extent and preferably has laterally a projection 256 or an engaging shoulder 256 for engaging with the engaging devices 236.

Starting from the initial position AS of the contacting device 200 (see FIG. 15), the securing of the conductor 20 in the contacting space KR of the contacting device 200 is explained in greater detail. In the initial position AS, the contacting device 200 is in an open position, that is to say, with an open contact spring 260 on the contact portion 110, the conductor 20 being able to be moved forwards through an opening opposite the side wall 240 into the contact clamping device 200 or the cage 201 thereof (contacting space KR). In this instance, the opening for the introduction of the conductor 20 is located between the two engaging devices 236, above the engaging tab 252 and below the free end of the upper wall 230 (see FIG. 15).

The conductor 20 is moved forwards through this opening manually or in an automated manner into the contacting space KR between the contact portion 110 and the contact spring 260 (see FIG. 15). If the conductor 20 is in the correct position thereof, the upper wall 230 or the contact spring 260 is simply moved downwards in the direction towards the lower wall 250, which can be carried out manually or by means of a tool 30. In this instance, the engaging devices 236 engage with the projections 256 on the lower wall 250 so that the contacting device 200 assumes its end position ES (FIG. 16). At the same time, the resilient plates 262 move towards the lower wall 250 and press the conductor 20 against the lower wall 250, whereby it is clamped in the contact clamping device 200.

The resilient plates 262 are preferably provided inside the contacting device 200 in such a manner that they extend in the transverse direction at least as far as the opening for the introduction of the conductor 20 does. Preferably, the resilient plates 262 even cover a larger region in the transverse direction than the conductor 20 or the opening for the introduction of the conductor 20 (see FIG. 17). Furthermore, those portions of the contacting device 200 which can be provided laterally at the outer side of the contact portion 110 form, inside the contacting device 200, the actual clamps, a single one of the two clamps being able to be closed by means of the engaging device 236 and the projection 256 thereof. A resilient force of the clamps originates from the lateral wall 240 or the transition region 240 at the other side of the through-recess 242.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practices in the art to which this invention pertains.

What is claimed is:

1. Connection device for a solar module, comprising a housing, at least one contact rail, which is arranged in the housing and at least one contacting device for contacting an electrical conductor, the contacting device comprising sidewalls with fixing portions being profiled for gripping side edges of the contact rail, the contacting device further comprising an upper wall, the inner side of which is opposite a surface of the contact rail, and clamping means being able to be moved at least between an initial position (AS) and an end position (ES), wherein the clamping means clamps the electrical conductor together with the at least one contact rail in the end position (ES).

2. Connection device according to claim 1, wherein the contacting device is constructed in such a manner that a contacting space (KR) is formed between an inner peripheral face of the contacting device and the contact rail.

3. Connection device according to claim 1, wherein the upper wall comprises a tool through-opening.

4. Connection device according to claim 1, wherein the contacting device comprises at least one side wall which has a positioning device, which extends in the longitudinal direction (L) of the contacting device.

5. Connection device according to claim 1, wherein the contacting device comprises at least one side wall which has at least one engaging device.

6. Connection device according to claim 1, wherein the contacting device is constructed integrally.

7. Connection device according to claim 1, wherein the contacting device is formed in one piece from a sheet metal material.

8. Connection device according to claim 1, wherein the clamping means protrudes from the upper wall into the contacting space (KR).

9. Connection device according to claim 8, wherein the clamping means has a tool engagement portion.

10. Connection device according to claim 8, wherein the clamping means abuts the contact rail in the initial position (AS).

11. Connection device according to claim 10, wherein the clamping means is comprised of a reversely bent contact having a contacting region in contact with the contact rail when in the initial position (AS).

12. Connection device according to claim 11, wherein the upper wall comprises a tool through-opening and wherein the clamping means comprises a tool engagement portion, whereby a tool may be positioned through the tool through-opening to contact the tool engagement portion and move the clamping means.

13. Connection device according to claim 11, wherein the contact rail is serrated in the area opposite the contacting region.

* * * * *